United States Patent
Cooper et al.

(10) Patent No.: US 7,042,936 B2
(45) Date of Patent: May 9, 2006

(54) DYNAMIC AMPLITUDE TILT EQUALIZER

(75) Inventors: Thomas R. Cooper, Torrance, CA (US); Timothy J. Gallagher, Encinitas, CA (US)

(73) Assignee: The Boeing Company, Chicago, IL (US)

( * ) Notice: Subject to any disclaimer, the term of this patent is extended or adjusted under 35 U.S.C. 154(b) by 833 days.

(21) Appl. No.: 10/126,861

(22) Filed: Apr. 18, 2002

(65) Prior Publication Data

US 2003/0198289 A1    Oct. 23, 2003

(51) Int. Cl.
*H03H 7/30* (2006.01)
*H04L 25/49* (2006.01)
*H03F 1/26* (2006.01)

(52) U.S. Cl. .................. 375/229; 375/296; 330/149

(58) Field of Classification Search ............ 375/229, 375/230, 232, 233, 295, 296, 316; 333/17.2, 333/18, 28 R, 24 R; 327/306, 308, 309, 327/317, 100; 329/315, 318–321; 455/114.3, 455/114.4; 330/149
See application file for complete search history.

(56) References Cited

U.S. PATENT DOCUMENTS

| | | | | | |
|---|---|---|---|---|---|
| 4,258,340 | A | * | 3/1981 | Ryu ........................... | 333/18 |
| 4,329,655 | A | * | 5/1982 | Nojima et al. ............. | 330/149 |
| 4,565,980 | A | * | 1/1986 | Ashida ....................... | 332/105 |
| 4,870,658 | A | * | 9/1989 | Suzuki et al. .............. | 375/230 |
| 5,877,653 | A | * | 3/1999 | Kim et al. .................. | 330/149 |
| 6,538,509 | B1 | * | 3/2003 | Ren ........................... | 330/149 |

* cited by examiner

*Primary Examiner*—Tesfaldet Bocure
*Assistant Examiner*—Vineeta S. Panwalkar
(74) *Attorney, Agent, or Firm*—Shimokaji & Associates, P.C.

(57) ABSTRACT

A system for equalizing amplitude tilt distortion in a signal includes an amplitude tilt maker and an amplitude tilt sensor. The input signal is split in the amplitude tilt maker between a signal through path and a phase shifted, time delayed signal path. The phase shifted, time delayed signal then passes through a voltage controlled attenuator. Combining the phase shifted, time delayed signal with the signal that travels along the signal through path provides the amplitude tilt. The tilt can be adjusted by changing the control voltage to the attenuator in order to compensate for amplitude tilt distortion in the input signal. The voltage controlled attenuator is controlled by the amplitude tilt sensor, which "senses" the tilt using a loop signal from the amplitude tilt maker.

17 Claims, 1 Drawing Sheet

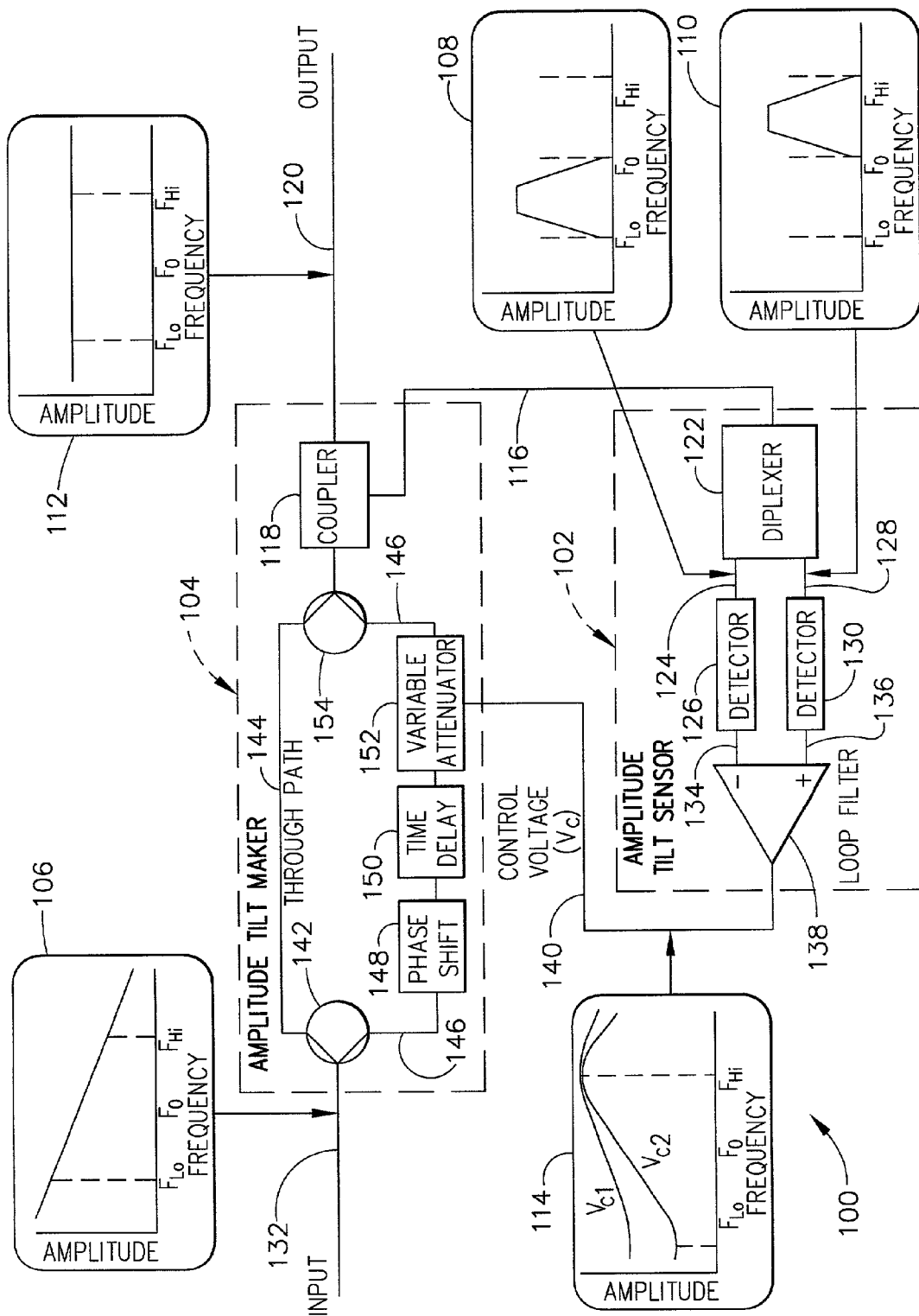

DYNAMIC AMPLITUDE TILT EQUALIZER

STATEMENT REGARDING FEDERALLY SPONSORED RESEARCH OR DEVELOPMENT

The invention described herein was made in the performance of work under a government funded research and development program. The United States Government may have certain rights to this invention.

BACKGROUND OF THE INVENTION

The present invention generally relates to wideband microwave radio communications and, more particularly, to a circuit for removing atmospherically induced amplitude tilt distortion, i.e., distortion of amplitude depending on frequency, from microwave radio signals without requiring demodulation.

Distortions can significantly degrade the performance of digital communication systems such as those used in multi-gigabit per second (Gbps) satellite links with multi-giga Hertz (GHz) bandwidths, for example, or terrestrial air links using Quadrature Phase Shift Keying (QPSK) modulation or 16 Quadrature Amplitude Modulation (16 QAM) modulation. For earth to satellite communication systems the most common distortions may be classified into two categories: atmospheric distortions and hardware distortions. For a narrow-band signal, i.e., a signal with bandwidth less than approximately 500 mega Hertz (MHz), the atmospheric distortion is generally manifested as a time varying amplitude attenuation that is independent of frequency within the bandwidth of the signal. An exception in which the amplitude attenuation for a narrow-band signal may depend on the frequency is the multi-path effect, which can occur when the line-of-sight propagation path of the signal is close to the ground.

In contrast, for a wideband signal, i.e., a signal with bandwidth greater than approximately 500 MHz, the amplitude attenuation due to atmospheric distortion is typically frequency and time dependent. Atmospheric distortions, the most common of which are attenuations of amplitude depending on frequency, referred to as "amplitude tilt" or "amplitude tilt vs. frequency" distortions, are generally simple in nature, and can change rapidly in time. For wideband atmospheric communication links, severe rainstorms have been shown to cause linear amplitude tilt of many decibels (dB) that change at rates as high as 10 Hz. Hardware distortions generally are more complex in nature, may include phase changes as well as amplitude attenuations, and typically change at much slower rates.

The conventional approach to removing both atmospheric and hardware types of distortions from a communications link signal is to use a multi-tap transversal filter, typically with 10 to 20 taps. The approach of using a multi-tap transversal filter requires first demodulating a signal, i.e. detecting symbols in the signal, sampling the demodulated signal, using complex algorithms to make calculations based on comparing the detected symbols to known symbols in order to determine the tap weights, and providing feedback to the multi-tap transversal filter for eliminating the distortions. Typically, this process takes several seconds or longer to complete. Moreover, if the atmospheric distortions are large enough to prevent data detection, the communications link cannot be established.

Equalizing both atmospheric and hardware types of distortions with the same hardware requires a system complex enough to eliminate hardware distortions yet fast enough to eliminate atmospheric distortions, when, in general, a more complex system is slower and a faster system is simpler. Thus a simpler faster device for eliminating the more rapidly changing atmospheric distortions, i.e. amplitude tilt, which can be used in conjunction with the more complex hardware of the standard equalizer approach for removing the more complex, but less rapidly changing, hardware-induced distortions, is desirable. In addition, a device that can eliminate amplitude tilt from a signal, regardless of the bandwidth of the signal or the type of modulation, such as QPSK or QAM, is also desirable.

As can be seen, there is a need for a fast and simple way to remove the most common atmospherically induced distortion, i.e., amplitude tilt versus frequency distortion, from wideband microwave signals without requiring demodulation, or symbol detection. There is also a need for removing amplitude tilt that is simple and fast and can be used in conjunction with conventional approaches for removing hardware distortions. Moreover, there is a need for a fast and simple way to remove amplitude tilt distortion which is bandwidth and modulation independent, i.e., that is suitable for use in any wideband microwave link, using any modulation format, and where atmospheric distortions degrade performance.

SUMMARY OF THE INVENTION

The present invention provides a fast and simple way to remove the most common atmospherically induced distortion, i.e., amplitude tilt versus frequency distortion, from wideband microwave signals without requiring demodulation, or symbol detection. The present invention also provides simple and fast removal of amplitude tilt distortion from wideband communication signals, which can be used in conjunction with conventional approaches for removing hardware distortions. Moreover, the present invention provides a fast and simple way to remove amplitude tilt distortion which is bandwidth and modulation independent, i.e., that is suitable for use in any wideband microwave link, using any modulation format, and where atmospheric distortions degrade performance.

In one aspect of the present invention, a system for equalizing amplitude tilt distortion in a signal may be conceptually divided into an amplitude tilt maker and an amplitude tilt sensor. The amplitude tilt maker portion of the system includes a voltage controlled attenuator. The voltage controlled attenuator can control the amplitude tilt of the output in order to compensate for amplitude tilt distortion in the input signal. The voltage controlled attenuator is controlled by the amplitude tilt sensor portion of the system, which "senses" the tilt using a loop signal from the amplitude tilt maker portion of the system.

In another aspect of the present invention, a system for equalizing amplitude tilt distortion in a signal includes an amplitude tilt maker and an amplitude tilt sensor. The input signal is split in the amplitude tilt maker between a signal through path and a phase shifted, time delayed signal path. The phase shifted, time delayed signal then passes through a voltage controlled attenuator. Combining the phase shifted, time delayed signal with the signal that travels along the signal through path provides the amplitude tilt. The tilt can be adjusted by changing the control voltage to the attenuator in order to compensate for amplitude tilt distortion in the input signal. The voltage controlled attenuator is controlled by the amplitude tilt sensor, which "senses" the tilt using a loop signal from the amplitude tilt maker.

In yet another aspect of the present invention, a system for equalizing amplitude tilt distortion in a signal includes an amplitude tilt maker and an amplitude tilt sensor. The input signal is split in the amplitude tilt maker between a signal through path and a phase shifted, time delayed signal path. The phase shifted, time delayed signal then passes through a voltage controlled attenuator. Combining the phase shifted, time delayed signal with the signal that travels along the signal through path provides the amplitude tilt. The tilt can be adjusted by changing the control voltage to the attenuator in order to compensate for amplitude tilt distortion in the input signal. The voltage controlled attenuator is controlled by the amplitude tilt sensor, which "senses" the tilt using a loop signal from the amplitude tilt maker. A coupler samples the output signal and provides a signal sample of the output signal to supply the loop signal to the amplitude tilt sensor. The amplitude tilt sensor includes a frequency diplexer, two amplitude detectors, and a loop filter. The frequency diplexer divides the coupled signal, i.e., the loop signal, into two bands: high frequency band and low frequency band. These two signals then drive the two amplitude detectors, which provide voltages proportional to the input amplitude to the loop filter. The loop filter automatically provides a voltage to the voltage controlled attenuator in the tilt maker to eliminate any tilt on the signal.

In a further aspect of the present invention, a method for removing amplitude tilt distortion from a radio signal includes steps of splitting an input signal between a signal through path and a phase shifted, time delayed signal path; passing the input signal through a variable attenuator for varying the amplitude tilt of the input signal; forming an output signal by combining signals from the signal through path and from the phase shifted, time delayed signal path; sampling the output signal and providing a signal sample of the output signal as a loop signal; using the loop signal to control the variable attenuator to vary the amplitude tilt so as to compensate in the output signal for an amplitude tilt distortion in the input signal.

In still a further aspect of the present invention, a method for more precisely removing tilt from the input signal would be realized by adding a third (or more) paths to the tilt maker. This, in conjunction with a slightly more complex feedback system (analog to digital converters, fast microprocessor, and digital to analog converters), would provide additional fidelity to the distortion removal process.

These and other features, aspects and advantages of the present invention will become better understood with reference to the following drawings, description and claims.

BRIEF DESCRIPTION OF THE DRAWINGS

FIG. 1 is a circuit block diagram of a dynamic amplitude tilt equalizer according to one embodiment of the present invention, with inset illustrations showing amplitude vs. frequency graphs of exemplary signals at various locations within the block diagram.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The dynamic amplitude tilt equalizer of the present invention may be used in communication systems where atmospheric distortions degrade performance, for example, in multi-gigabit per second (Gbps) satellite links with multi-giga Hertz (GHz) bandwidths or in terrestrial air links such as wideband microwave communication links. The present invention provides a fast and simple way to remove the most common atmospherically induced distortion, i.e., amplitude tilt versus frequency distortion, from wideband communication signals. The present invention is bandwidth and modulation independent; that is, various embodiments of the present invention are suitable for use in any wideband microwave link, using any modulation format. For example, one embodiment of the present invention has been designed, built, and tested for a 7.2 Gbps 8 Phase Shift Keying (8 PSK) system used with a terrestrial air link to quantify the atmospheric effects on the signals. Also, for example, one embodiment is suitable for use with a 16 Quadrature Amplitude Modulation (16 QAM) system. Thus, the present invention displays an advantage over prior art approaches that must be modified to accommodate the type of modulation used in a system.

The dynamic amplitude tilt equalizer of the present invention is a simple and fast way to remove the amplitude tilt caused by atmospheric distortions that does not require demodulation, or symbol or bit detection. Whereas conventional, prior art approaches for controlling atmospheric distortions require sampling of a demodulated signal, making complex calculations to determine the tap weights, and providing feedback to a multi-tap transversal filter, the approach of the present invention more simply samples the power level in the high and low side of the signal's frequency band using an amplitude tilt sensor, and the amplitude tilt sensor drives one tap of a two tap transversal filter, referred to as a tilt maker. Because complex calculations and multi-tap transversal filters are not required, the approach of the present invention is simpler and can easily react to fast changes in amplitude tilt caused by atmospheric dynamics. Unlike prior art processes for equalization, which typically take many seconds or longer to complete, one embodiment of the present invention has demonstrated equalization times within a few milliseconds. Faster equalization times also are possible with the present invention.

The present invention's simple and fast removal of amplitude tilt distortion from wideband communication signals can be used in conjunction with conventional approaches for removing hardware distortions. Because the approach of the present invention is simpler, as described above, an embodiment of the present invention requires much less hardware to implement than previous, prior art approaches. After the atmospherically induced amplitude tilt has been removed, conventional, prior art approaches can be used to eliminate hardware distortions. The present invention can be used in conjunction with standard, prior art approaches by using the present invention to eliminate amplitude tilt across the band prior to using the more complex hardware of the standard equalizer approach to eliminate hardware distortions. The present invention, by eliminating some distortion from the signal before passing the signal to the standard hardware, allows the standard hardware to do a better job of removing the more complex, hardware induced distortions from the signal.

Referring now to FIG. 1, an example embodiment for removing amplitude tilt distortion from wideband radio signals is illustrated by a circuit block diagram of dynamic amplitude tilt equalizer 100. FIG. 1 shows that the circuit of dynamic amplitude tilt equalizer 100 may be conceptually divided by functionality into blocks, one functional block including amplitude tilt sensor 102 and one functional block including amplitude tilt maker 104. FIG. 1 also shows insets 106, 108, 110, 112, and 114 with amplitude vs. frequency graphs to conceptually illustrate the frequency characteristics of various signals in the circuit of dynamic amplitude tilt equalizer 100.

Amplitude tilt sensor 102 receives loop signal 116 from coupler 118 at the output of amplitude tilt maker 104. Coupler 118 samples wideband output signal 120 of amplitude tilt maker 104 and provides the signal samples of wideband output signal 120 as loop signal 116 to frequency diplexer 122, which may be included in amplitude tilt sensor 102. Frequency diplexer 122 divides loop signal 116 into two sides of the frequency band: a low frequency side and a high frequency side. The low frequency side is shown in each of the insets 106, 108, 110, 112, and 114 as frequencies between $F_{Lo}$ and $F_0$, where $F_0$ may also be referred to as the center frequency. The high frequency side is shown in each of the insets as frequencies between $F_0$ and $F_{Hi}$. The frequencies $F_{Lo}$, $F_0$, and $F_{Hi}$ may depend on the particular application of dynamic amplitude tilt equalizer 100. For example, for a signal with 4 GHz bandwidth, $F_{Lo}$ may be 1 GHz, $F_0$ may be 3 GHz, and $F_{Hi}$ may be 5 GHz.

Frequency diplexer 122 provides a low frequency sample 124 of loop signal 116, as illustrated in inset 108, to drive amplitude detector 126. Frequency diplexer 122 provides a high frequency sample 128 of loop signal 116, as illustrated in inset 110, to drive amplitude detector 130. If loop signal 116 has no amplitude tilt, which may, for example, reflect the fact that incoming input signal 132 has no atmospherically induced amplitude tilt distortion, the voltage outputs 134 and 136, respectively, of amplitude detectors 126 and 130 will be substantially equal. If amplitude tilt has been added to loop signal 116, as a result, for example, of atmospherically induced distortions in input signal 132, as illustrated in inset 106, the voltage output 134 of amplitude detector 126 will be different from the voltage output 136 of amplitude detector 130.

The voltage output 134 of amplitude detector 126 and the voltage output 136 of amplitude detector 130 are fed as inputs to loop filter 138. Loop filter 138 outputs control voltage $V_c$ 140 to tilt maker 104. The amplitude vs. frequency graph shown in inset 114 illustrates an example of two control voltages $V_c$ 140, $V_{c1}$ at an initial time $t_1$ and $V_{c2}$ at a later time $t_2$. The initial control voltage $V_c$ 140 at initial time $t_1$ is labeled $V_{c1}$ in inset 114, and the control voltage $V_c$ 140 at a later time $t_2$ is labeled $V_{c2}$ in inset 114. Loop filter 138 adjusts control voltage $V_c$ 140 to tilt maker 104 until the loop filter input voltages, i.e., voltage output 134 and voltage output 136, are substantially the same. The condition that the loop filter input voltages are approximately the same may be achieved when there is no amplitude tilt to wideband output signal 120 of amplitude tilt maker 104, as illustrated in inset 112, or, equivalently, when there is no amplitude tilt to loop signal 116, which is the input to amplitude tilt sensor 102. A person of ordinary skill in the art will appreciate that the loop filter bandwidth determines the loop equalization time, i.e., the amount of time needed to achieve substantial equality of the loop filter input voltages, of the loop comprising amplitude tilt sensor 102 and amplitude tilt maker 104.

Amplitude tilt maker 104 is a two tap transversal filter. Wideband input signal 132 is fed as input to amplitude tilt maker 104. Wideband input signal 132 may be provided to amplitude tilt maker 104, for example, from a radio frequency receiver front end. Wideband input signal 132 may be divided by splitter 142 into two signal paths, a through path and a path that is delayed, phase shifted, and attenuated relative to the through path. The through path may be signal through path 144. The delayed, phase shifted, and attenuated path may be phase shifted, time delayed signal path 146. Input signal 132 in phase shifted, time delayed signal path 146 may be phase shifted by a phase shift module 148, delayed by time delay module 150, and attenuated by voltage controlled attenuator 152. As may be appreciated by one of ordinary skill in the art, the time delay determines the null to null spacing of the loop comprising amplitude tilt sensor 102 and amplitude tilt maker 104. The phase shift determines the center frequency of the peak amplitude. Control voltage $V_c$ 140 controls voltage controlled attenuator 152 to vary the amplitude tilt that amplitude tilt maker 104 introduces into input signal 132 to compensate for the amplitude tilt distortion in input signal 132. Time delayed, phase shifted, attenuated input signal 132 in phase shifted, time delayed signal path 146 may be combined in combiner 154 with input signal 132 in signal through path 144 to produce wideband output signal 120 from amplitude tilt maker 104.

The approach of using a two tap transversal filter can also be applied to a dynamic amplitude tilt equalizer using a transversal filter with three or more transversal filter taps. The use of additional taps can improve amplitude tilt equalization by more closely canceling the nearly linear distortion at 20 GHz caused by atmospheric effects. The use of additional taps may be required, for example, because signals with higher order modulation, such as 16 QAM, 64 QAM, and 128 QAM, are more sensitive to distortions. The use of additional taps may also be required because the design of the communication system may demand higher fidelity. Another example where the use of additional taps may be required is a communication system using frequencies at which the amplitude vs. frequency curve is non-linear.

For example, to implement a dynamic amplitude tilt equalizer using a transversal filter with more than two taps, the same method for sensing tilt exemplified by amplitude tilt sensor 102 could be used, but a simple processor with a look up table could replace loop filter 138 and provide the tap weights for more than two taps. Because a complicated algorithm would not be required, due to the use of a simple look up table process, the simple look up table processor replacing loop filter 138 could be implemented in hardware that could have a short enough response time to be adequate for atmospheric effects.

It should be understood, of course, that the foregoing relates to preferred embodiments of the invention and that modifications may be made without departing from the spirit and scope of the invention as set forth in the following claims.

We claim:

1. A system for equalizing amplitude tilt distortion in a signal, comprising:
    an amplitude tilt maker including a voltage controlled attenuator, wherein an input signal to said amplitude tilt maker passes through said voltage controlled attenuator and whereby said amplitude tilt maker varies an amplitude tilt of said input signal to form an output signal;
    an amplitude tilt sensor receiving a loop signal from said amplitude tilt maker, said amplitude tilt sensor processing said loop signal and controlling said voltage controlled attenuator to vary said amplitude tilt so as to compensate in said output signal for an amplitude tilt distortion in said input signal;

a frequency diplexer;

an amplitude detector, wherein said frequency diplexer provides a frequency sample of said loop signal to drive said amplitude detector; and a loop filter, wherein a voltage output of said amplitude detector is fed as an input to said loop filter; and said loop filter outputs a control voltage to said voltage controlled attenuator to control said voltage controlled attenuator.

2. The amplitude tilt equalizing system of claim 1, further comprising a signal through path and a phase shifted, time delayed signal path through said voltage controlled attenuator, wherein said input signal to said amplitude tilt maker is split between said signal through path and said phase shifted, time delayed signal path and said output signal is formed by combining signals from said signal through path and from said phase shifted, time delayed signal path through said voltage controlled attenuator.

3. The amplitude tilt equalizing system of claim 2, further comprising a splitter and a combiner wherein said input signal is split by said splitter into said signal through path and said phase shifted, time delayed signal path and wherein a time delayed, phase shifted, attenuated input signal in said phase shifted, time delayed signal path is combined in said combiner with said input signal in said signal through path to produce said output signal.

4. The amplitude tilt equalizing system of claim 2, further comprising a phase shift module and a time delay module, wherein said input signal in said phase shifted, time delayed signal path is phase shifted by said phase shift module, delayed by said time delay module, and attenuated by said voltage controlled attenuator.

5. The amplitude tilt equalizing system of claim 1, further comprising a coupler, wherein said coupler samples said output signal and provides a signal sample of said output signal as said loop signal to said amplitude tilt sensor.

6. The amplitude tilt equalizing system of claim 1 wherein said loop filter comprises a transversal filter with more than two taps.

7. The amplitude tilt equalizing system of claim 6 wherein said loop filter comprises a processor with a look up table providing the tap weights for more than two taps.

8. A system for equalizing amplitude tilt distortion in a signal, comprising:

an amplitude tilt maker comprising a signal through path, a phase shifted, time delayed signal path, and a voltage controlled attenuator, wherein an input signal to said amplitude tilt maker is split between said signal through path and said phase shifted, time delayed signal path, said input signal passes through said voltage controlled attenuator whereby said amplitude tilt maker varies an amplitude tilt of said input signal, and wherein an output signal is formed by combining signals from said signal through path and from said phase shifted, time delayed signal path;

an amplitude tilt sensor receiving a loop signal from said amplitude tilt maker, said amplitude tilt sensor using said loop signal to control said voltage controlled attenuator to vary said amplitude tilt so as to compensate in said output signal for an amplitude tilt distortion in said input signal;

a frequency diplexer;

an amplitude detector, wherein said frequency diplexer provides a frequency sample of said loop signal to drive said amplitude detector; and a loop filter, wherein a voltage output of said amplitude detector is fed as an input to said loop filter; and said loop filter outputs a control voltage to said voltage controlled attenuator to control said voltage controlled attenuator.

9. The amplitude tilt equalizing system of claim 8, further comprising a splitter and a combiner wherein said input signal is split by said splitter into said signal through path and said phase shifted, time delayed signal path and wherein a time delayed, phase shifted, attenuated input signal in said phase shifted, time delayed signal path is combined in said combiner with said input signal in said signal through path to produce said output signal.

10. The amplitude tilt equalizing system of claim 8, further comprising a coupler, wherein said coupler samples said output signal and provides a signal sample of said output signal as said loop signal to said amplitude tilt sensor.

11. The amplitude tilt equalizing system of claim 8, further comprising a phase shift module and a time delay module, wherein said input signal in said phase shifted, time delayed signal path is phase shifted by said phase shift module, delayed by said time delay module, and attenuated by said voltage controlled attenuator.

12. A system for equalizing amplitude tilt distortion in a signal, comprising:

an amplitude tilt maker comprising a signal through path, a phase shifted, time delayed signal path, a splitter, a combiner, a phase shift module, a time delay module, and a voltage controlled attenuator, wherein an input signal to said amplitude tilt maker is split by said splitter between said signal through path and said phase shifted, time delayed signal path, said input signal in said phase shifted, time delayed signal path is phase shifted by said phase shift module, delayed by said time delay module, and attenuated by said voltage controlled attenuator, whereby said amplitude tilt maker varies an amplitude tilt of said input signal, and a time delayed, phase shifted, attenuated input signal in said phase shifted, time delayed signal path is combined in said combiner with said input signal in said signal through path to produce an output signal;

a coupler, wherein said coupler samples said output signal and provides a signal sample of said output signal as a loop signal; and an amplitude tilt sensor comprising a frequency diplexer, an amplitude detector, and a loop filter, wherein said frequency diplexer receives said loop signal from said coupler, said frequency diplexer provides a frequency sample of said loop signal to drive said amplitude detector, a voltage output of said amplitude detector is fed as an input to said loop filter, and said loop filter outputs a control voltage to said voltage controlled attenuator to control said voltage controlled attenuator to vary said amplitude tilt so as to compensate in said output signal for an amplitude tilt distortion in said input signal.

13. A method for removing amplitude tilt distortion from a radio signal, comprising steps of:

splitting an input signal between a signal through path and a phase shifted, time delayed signal path;

passing said input signal through a voltage controlled attenuator for varying an amplitude tilt of said input signal;

forming an output signal by combining signals from said signal through path and from said phase shifted, time delayed signal path;

sampling said output signal and providing a signal sample of said output signal as a loop signal; and using said loop signal to control said voltage controlled attenuator to vary said amplitude tilt so as to compensate in said output signal for an amplitude tilt distortion in said input signal, including:
  providing a frequency sample of said loop signal to drive an amplitude detector;
  feeding a voltage output of said amplitude detector as an input to a loop filter; and
  outputting a control voltage from said loop filter to said voltage controlled attenuator to control said voltage controlled attenuator.

14. The method of claim 13 wherein a time delayed, phase shifted, attenuated input signal in said phase shifted, time delayed signal path is combined with said input signal in said signal through path to produce said output signal.

15. The method of claim 13 wherein said input signal is phase shifted and delayed in said phase shifted, time delayed signal path, and said input signal in said phase shifted, time delayed signal path is attenuated by said voltage controlled attenuator.

16. The method of claim 13 wherein said loop filter comprises a transversal filter with more than two taps.

17. The method of claim 16 wherein said loop filter comprises a processor with a look up table providing the tap weights for more than two taps.

* * * * *